United States Patent [19]
Kopp et al.

[11] Patent Number: 6,011,701
[45] Date of Patent: Jan. 4, 2000

[54] COMPONENT HOUSING FOR INTEGRATION WITH FURNITURE

[75] Inventors: Siegried Helmut Kopp, Renningen; Jürgen Günther Häberle, Böblingen; Tim Klaus Georg Schwegler, Sindelfingen, all of Germany

[73] Assignee: DMT GmbH, Feinwerktechnische Komplettlosungen, Boblingen, Germany

[21] Appl. No.: 08/936,039

[22] Filed: Sep. 23, 1997

[30] Foreign Application Priority Data

Mar. 8, 1997 [DE] Germany ............ 297 04 237 U

[51] Int. Cl.⁷ .................................................... H05K 7/20
[52] U.S. Cl. .................. 361/818; 361/683; 361/730; 361/816; 312/223.2; 454/184; 174/35 MG
[58] Field of Search .......................... 361/681, 683, 361/685–695, 730–736, 726, 795, 808, 816, 818; 312/223.2, 334.7, 319.1, 298; 340/585, 507; 174/35 MS, 35 GC, 16.1, 35 MG; 439/358; 248/139; 62/229, 418; 459/184

[56] References Cited

U.S. PATENT DOCUMENTS

| | | | |
|---|---|---|---|
| 3,715,629 | 2/1973 | Swengel, Sr. ............. | 317/101 R |
| 3,845,435 | 10/1974 | Georgopulos ............. | 336/65 |
| 4,084,214 | 4/1978 | Eppich .................... | 361/394 |

(List continued on next page.)

FOREIGN PATENT DOCUMENTS

| | | |
|---|---|---|
| 1109908 | 9/1981 | Canada . |
| 0 546 211 B1 | 7/1994 | European Pat. Off. . |
| 1 963 469 | 12/1969 | Germany . |

(List continued on next page.)

OTHER PUBLICATIONS

Rekord–Verdächtig, "Ein komplettes Server–Gehäuse in sechs Monaten zur Serienreife entwickeln", *Elektronik Praxis*, Jun. 20, 1997, 12, 112–114 (English translation included).

"Flexible FPC–Folic als Schirm bietet neue Anwendungen", *Components*, 1996, 34, 1 (english translation of article only).

Mahn, J. et al., "HP–PAC: A New Chassis and Housing Concept for Electronic Equipment", *Hewlett–Packard J.*, Aug. 1994, 23–28.

Tuscarora Incorporated, "Innovative foam assembly chassis for electromechanical devices", *E–PAC*, 1 brochure page.

Smith, B., "Power Workstation at a Pentium Price", *BYTE*, 1994, 2 pages.

Deutsches Patentamt, München, den 31. Juli 1997, 3 pages.

Cole, R., "Fast fabrication with foam chassis", *Machine Design*, Mar. 9, 1995, 4 pages.

*Primary Examiner*—Leo P. Picard
*Assistant Examiner*—Michael Datskovsky
*Attorney, Agent, or Firm*—Woodcock Washburn Kurtz Mackiewicz & Norris LLP

[57] ABSTRACT

The housing assembly for holding device components comprises a housing and a chassis and can be integrally coupled to a standard piece of furniture. The housing may be in the form of a drawer which can be inserted and withdrawn from a standard unit of furniture such as a desk or cabinet. The drawer has perforations in its bottom and sides for air flow and is preferably made from a metal or metallic material but alternatively may be made from a non-metallic material which is lined with a metallic film. The chassis is made of plastic, preferably expanded polypropylene and may comprise two parts in which are secured equipment components. Projections extend from the sides of the chassis and extend to the drawer walls and thereby create air ducts through which air may flow to cool the components situated in the chassis. Plastic inserts may be placed in the air ducts created by the projections so as to direct the air flow within the assembly.

26 Claims, 4 Drawing Sheets

U.S. PATENT DOCUMENTS

| | | | |
|---|---|---|---|
| 4,296,454 | 10/1981 | Wong | 361/380 |
| 4,310,870 | 1/1982 | Kia et al. | 361/415 |
| 4,527,285 | 7/1985 | Kekas et al. | 455/607 |
| 4,585,122 | 4/1986 | Stegenga | 206/334 |
| 4,667,270 | 5/1987 | Yagi | 361/380 |
| 4,768,286 | 9/1988 | Ketcham | 29/841 |
| 4,864,469 | 9/1989 | Boudon | 361/395 |
| 4,926,291 | 5/1990 | Sarraf | 361/384 |
| 5,045,977 | 9/1991 | Cesar | 361/424 |
| 5,460,441 | 10/1995 | Hastings et al. | 312/298 |
| 5,473,507 | 12/1995 | Schwegler et al. | 361/690 |
| 5,587,877 | 12/1996 | Ryan et al. | 361/683 |
| 5,644,472 | 7/1997 | Klein | 361/695 |

FOREIGN PATENT DOCUMENTS

| | | |
|---|---|---|
| 24 39 972 A1 | 3/1976 | Germany . |
| 137 306 | 8/1979 | Germany . |
| 34 47 791 A1 | 7/1986 | Germany . |
| 89 11 405 U1 | 12/1989 | Germany . |
| 39 22 188 C2 | 10/1992 | Germany . |
| 92 07 735 U1 | 10/1992 | Germany . |
| 92 17 174 U1 | 3/1993 | Germany . |
| 93 04 431 U1 | 9/1993 | Germany . |
| 91 16 755 U1 | 12/1993 | Germany . |
| 295 05 578 U1 | 7/1995 | Germany . |
| 44 47 466 A1 | 11/1995 | Germany . |
| 196 20 881 | 11/1996 | Germany . |
| 59 074082 | 4/1984 | Japan . |

OTHER PUBLICATIONS

Grundig Technische Informationen, "Sicherheits–Bausteine, Sicher wie ein Safe", May 1979, 55–60 (translation provided).

Yankee, H.W., "Manufacturing Processes", Prentice–Hall, 1979, 728.

COMPONENT HOUSING FOR INTEGRATION WITH FURNITURE

BACKGROUND OF THE INVENTION

1. Field of the Invention

The present invention relates to a housing assembly for equipment components. In particular, the present invention provides a housing assembly designed to be functionally and integrally coupled with furniture such as cabinets and desks.

2. Description of the Prior Art

Generally, a chassis for holding equipment components is known. Depending upon the nature of the equipment, the components may be printed circuit boards, storage disks, ventilators, loudspeakers, cooling units, pumps, gear units, etc. Generally, the individual components are held in the chassis by mechanical fixtures whereby the components are arranged in a specific fixed position relative to other components. Such a chassis generally consists of a frame with a number of partitions in which the components are fitted. Typically, the frame itself is attached to an external housing of the device.

Metal chassis are often complicated and expensive to design and assemble. Bolts, screws, rivets, or other attachment means are needed to secure components to a metal chassis. Metal chassis are rigid and therefore require precision machining of the chassis as well as the components attached to the chassis.

The introduction of plastic components has further complicated chassis design. Plastic components require electrical shielding. For example, plastic components of an electrical device may need to be covered with conductive material. Alternatively metal plates or foil must be attached to the chassis. For these reasons, it has proven to be structurally and mechanically complicated, as well as expensive, to assemble a chassis having plastic components.

Plastic chassis have been developed to overcome some of the shortcomings of metal chassis and the difficulties presented by plastic components. Typically, plastic chassis are designed for a specific device, such as a computer or an electronic measuring instrument. The chassis is formed by a support unit made of plastic that is shaped to match the outer shapes of the components. The components are held in the chassis by positive locking without attachment elements such as screws and rivets and thereby overcome some of the shortcomings of metal chassis.

A plastic chassis may comprise a lower part and an upper part. Components are fitted into the lower part of the support unit and the upper part is placed over the lower part. The components fit snugly into the receptacle areas created by recesses in the lower and upper chassis areas. In some embodiments, the upper part and the lower part are hinged to each other along one edge so that the upper part can be swivelled upwards to permit access to the components fitted in the lower part. A plastic chassis can be configured so that recesses exist at different levels, with one level being located above the other. This allows for positioning components one above each other. Often, a plastic chassis has ventilation ducts that are molded into the plastic. A ventilator is located in one of the ventilation ducts in such a way that the flow of air produced by the ventilator is directed over components that need to be cooled.

Although plastic chassis are an improvement over metal chassis, there remains a need for an improved housing assembly which can be integrated into typical spaces and furniture so as to provide for quick and easy access while maintaining an aesthetically appealing environment. Often, precision equipment such as that typically housed in the above described plastic chassis must be stored in specially designated rooms or areas because of the size and shape of the housing. The use of such specialized rooms is an inefficient use of space and does not provide for quick and easy access to the equipment.

Further, current chassis cannot easily be integrated into typical office spaces and furniture. Generally, equipment may be placed on tabletops or on the floor and cannot be integrated with the furniture found in a home, office, or even laboratory. Such shortcomings in the art lead to conspicuous and random placement of equipment which is aesthetically unappealing as well as an inefficient use of space.

It is therefore desirable to provide an improved housing assembly which can be integrated into typical spaces and furniture so as to provide for quick and easy access while maintaining an aesthetically appealing environment.

SUMMARY OF THE INVENTION

Accordingly, it is the general object of the current invention to provide a housing assembly that can be integrated into typical work spaces and furniture so as to provide for quick and easy access to equipment while maintaining an aesthetically appealing environment.

Briefly, this object, as well as other objects of the current invention, is accomplished in an assembly for holding components, integrally cooperating with a unit of furniture, comprising a chassis for holding the components and a housing into which the chassis is substantially placed, wherein the housing is integrally interfaced with the unit of furniture. The housing may be substantially inserted into the unit of furniture to provide storage for the chassis and the components situated therein and may also be removed from the unit of furniture so as to provide access to the chassis and the components situated therein.

In a preferred embodiment of the invention the housing is shaped as a drawer to be inserted into a desk or cabinet. The housing comprises a bottom having plurality of recesses therein and vertical walls extending from the bottom. The walls have perforations therein through which air may flow. The housing is preferably made of a metallic material or alternatively may be made of a non-metallic material which has a metallic film inserted therein.

The chassis is made of expanded polypropylene which has been molded to conform to the outer shape of the various components that are to be situated in the chassis. The chassis comprises a lower chassis part and an upper chassis part. The lower chassis part has: a plurality of cavities therein for receiving the components; a plurality of projections extending downward from the bottom of the lower chassis part which integrally cooperate with the recesses in the bottom of the housing; and a plurality of projections extending sideways from the lower chassis part to the vertical walls of the housing for holding the lower part of the chassis in place relative to the housing and for providing clearance between the walls of the housing and thereby create air channeling ducts for air to flow through the housing to the components in the chassis. The upper chassis part which is integrally connected to the lower chassis part and which cooperates with the lower chassis part to hold the components in place, has: a plurality of cavities for receiving the components when placed over the lower chassis part; a plurality of projections extending sideways from the upper chassis part to the vertical walls of the housing for holding the upper chassis in place relative to the housing and for providing clearance between the walls and the housing and thereby create channeling ducts for air to flow through the housing to the components in the chassis.

In the above-described embodiment, the housing assembly further comprises at least one duct insert which is positioned in the channeling ducts created between the housing and the upper and lower chassis parts by the projections from the upper and lower chassis parts, so as to direct the flow of air to the components as appropriate.

The housing assembly further comprises a metallic shielding member which is positioned substantially over the upper chassis part so as to shield the components from electrical disturbances.

The lower chassis part has at least one support element integrated therein for providing support to a component such as a disk drive. The upper chassis part has a plastic flap hinged therefrom for securing at least one disk drive.

BRIEF DESCRIPTION OF THE DRAWINGS

The objects and advantages of the invention are further apparent from the following detailed description of presently preferred exemplary embodiments of the invention taken in conjunction with the accompanying drawings, of which.

DETAILED DESCRIPTION OF PRESENTLY PREFERRED EMBODIMENTS

A housing assembly with the above-mentioned beneficial features in accordance with a presently preferred exemplary embodiment of the invention will be described below with reference to FIGS. 1–5. It will be appreciated by those of ordinary skill in the art that the description given herein with respect to those figures is for exemplary purposes only and is not intended in any way to limit the scope of the invention.

The inventive housing assembly comprises a housing and a plastic chassis for holding device components. The housing is formed to be integrally combined with a piece of furniture. In the presently preferred embodiment the housing is formed as a drawer which can be inserted into a piece of furniture such as a desk or cabinet. Device components are placed in the chassis which is subsequently placed in the drawer. In the presently preferred embodiment the chassis comprises two components a lower part and upper part but may comprise more or less than two parts. The drawer can be inserted or withdrawn from the piece of furniture and thereby provide easy access to the chassis and the device components situated in the chassis. By means of the inventive housing assembly, it is possible to accommodate computers, measuring instruments, laboratory equipment, multimedia systems or similar devices in the drawer of a desk, laboratory bench, or any other piece of furniture.

Figure 1:
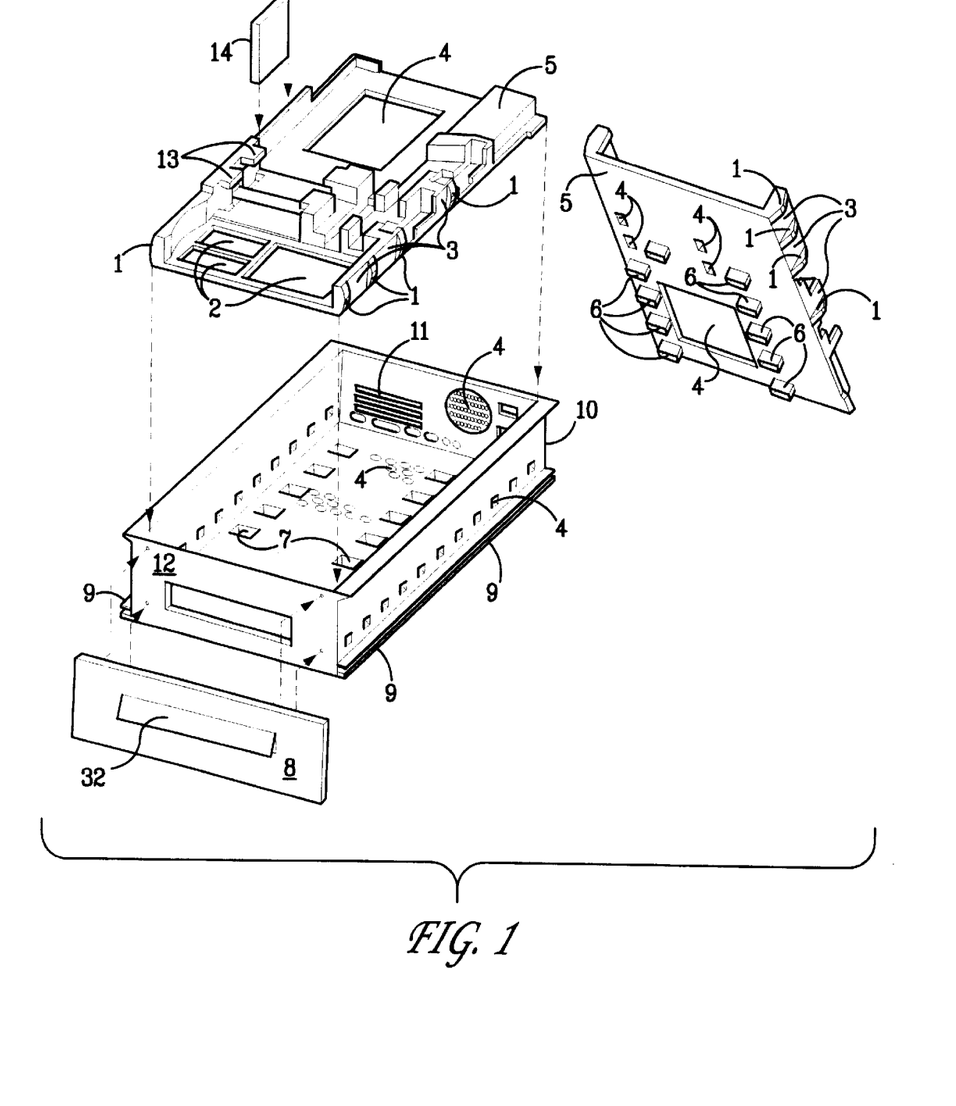
FIG. 1 is an exploded view of an embodiment of the inventive housing assembly prepared as a drawer for insertion into in a piece of furniture.

Referring to the drawings, there is shown in FIG. 1 an exploded view of an embodiment of the inventive housing assembly prepared as a drawer 12 to be inserted into a piece of furniture such as a desk. The drawer 12 can be made solely of metal or any non-metallic material such as wood or plastic. A drawer 12 produced from non-metallic materials should be lined with a layer of metal foil or enclosed within a thin metal plate which provides electric shielding. Electrically protective shielding can also be provided by wrapping the chassis 5, 17 (not shown) in metal foil or metallicised plastic film. The drawer 12 used to house the chassis 5 need not be specially designed or manufactured to operate with a particular piece of furniture but may be an existing drawer from the relevant piece of furniture.

In the preferred embodiment, the chassis 5 component of the housing assembly is made of plastic, preferably expanded polypropylene (EPP). Expanded polypropylene is commonly used as a packaging material. Production of an expanded polypropylene chassis in accordance with this invention involves completion of several steps. First, the polypropylene granulate is foamed using known processes to form small polypropylene beads. The granulate contains carbon so that the finished plastic is electrically conductive and thereby resistive to electrostatic charging. The beads are injected at a pressure level of about 4 bar into a mold that has the same shape as the required chassis structure. The injection of the beads under pressure has the effect of reducing the volume. Thereafter, a vacuum is applied so that the volume increases and the beads take on the shape of the mold. Next, steam at a temperature of about 180° C. is blown into the mold, which causes the beads to coalesce on their surface (cross-linking). The mold is opened and the foam plastic is removed for subsequent tempering.

Expanded polypropylene has several advantageous properties which make it a suitable plastic material for the chassis 5 of this invention. Expanded polypropylene is dimensionally stable and compliant such that it absorbs energy. These features guarantee that the components housed in the chassis 5 are given effective impact protection. Expanded polypropylene in the 60 to 80 grams/liter range provides good dimensional stability and impact absorption. Of course, the hardness of the plastic and its impact-absorption properties can be adapted to the requirements of various applications by changing the density level of the expanded polypropylene. Typically, lowering the density of expanded polypropylene results in a softer chassis 5 which has better impact-absorption properties. A density range of 20 to 80 grams/liter may be used depending upon the particular application.

Expanded polypropylene remains stable at varying temperatures. Temperature stability is an important attribute for applications such as those of the present invention wherein components housed in the chassis 5 generate a large amount of heat. It should be noted, however, that applicants have determined that the temperature of the components in a chassis 5 and housing 12 produced in accordance with the present invention is somewhat lower than in a conventional device with the same components. Applicants attribute this to the controlled and improved air direction flow resulting from the air ducts which are part of the present invention and which are described below. Because the expanded polypropylene chassis 5 does not contain any metal or other materials, it can be completely recycled.

Expanded polyurethane or polyethylene share some of these same advantageous properties and therefore may be used to form the chassis 5. The term "plastic" as used herein refers to a lightweight, dimensionally stable material with impact-absorbent properties that is preferably a synthetic, formable material. The present housing assembly can also be implemented with materials that are biological in origin.

If a combustible plastic is used for the chassis 5, fire protection can be provided by incorporating a carbon dioxide cartridge (not shown) inside the chassis 5. This carbon dioxide cartridge may be linked to a heat sensor (not shown) which monitors the temperature and insures that carbon dioxide is released when a specific temperature has been exceeded.

As shown in FIG. 1, the housing or drawer 12 in the present embodiment has air inlet/outlet openings 4 in all four walls and in its base. The air inlet/outlet openings 4 can have a wide range of different shapes and sizes depending on the requirements, as can be seen clearly from the various shapes shown in FIG. 1. Alternatively, the drawer 12 may be made entirely or partially of perforated material.

The drawer 12 is provided on its base with locking holes or recesses 7 into which may be positioned corresponding locking and spacing elements 6 extending from the lower part 5 of the plastic chassis. The locking recesses 7 and spacing elements 6 secure the chassis lower part 5 to the drawer 12 so that the chassis 5 forms an integral unit together with the drawer 12. The recesses 7 and spacing elements 6 insure that there is a gap between the lower part 5 of the chassis and the base of the drawer 12 through which air may flow.

Projections 1 are provided on both sides of the lower part 5 of the chassis. The projections 1 compensate for tolerances when the lower part 5 of the chassis is fitted in the drawer 12. The plastic from which the projections 1 are made is sufficiently compliant such that the projections will deform sufficiently where the chassis does not fit perfectly into the drawer 12. The projections 1 may take numerous shapes but preferably are convex and wedge-shaped or double wedge-shaped. The air inlet/outlet openings 4 in the walls of the drawer 12 and the gaps between the projections 1 operate to form air channeling ducts 3. The flow of air through the housing assembly to particular components can be controlled by strategically placing foam plastic parts 14 in the gaps between projections 1 so as to direct the air through the chassis 5. The modular plastic parts 14 make it possible to control the volume and speed of cooling air and discharge air for particular components. Also, the lower part 5 of the chassis has integrated supports and clamping elements 13 which may be used to hold disk drives or similar units.

The drawer 12 has guide rails 9 located on two opposite sides. These rails serve to guide the drawer 12 when it is inserted into a piece of furniture such as a desk. In the preferred embodiment, the drawer 12 is provided with a front panel 8 that covers the air inlet/outlet opening 4 located on the front of the drawer. The front panel 8 has a handle that is shaped in such a way that it forms an air inlet for the opening 4 located underneath. An opening 11 for plug-in board electrical connections is located at the back of the drawer 12.

Figure 2:
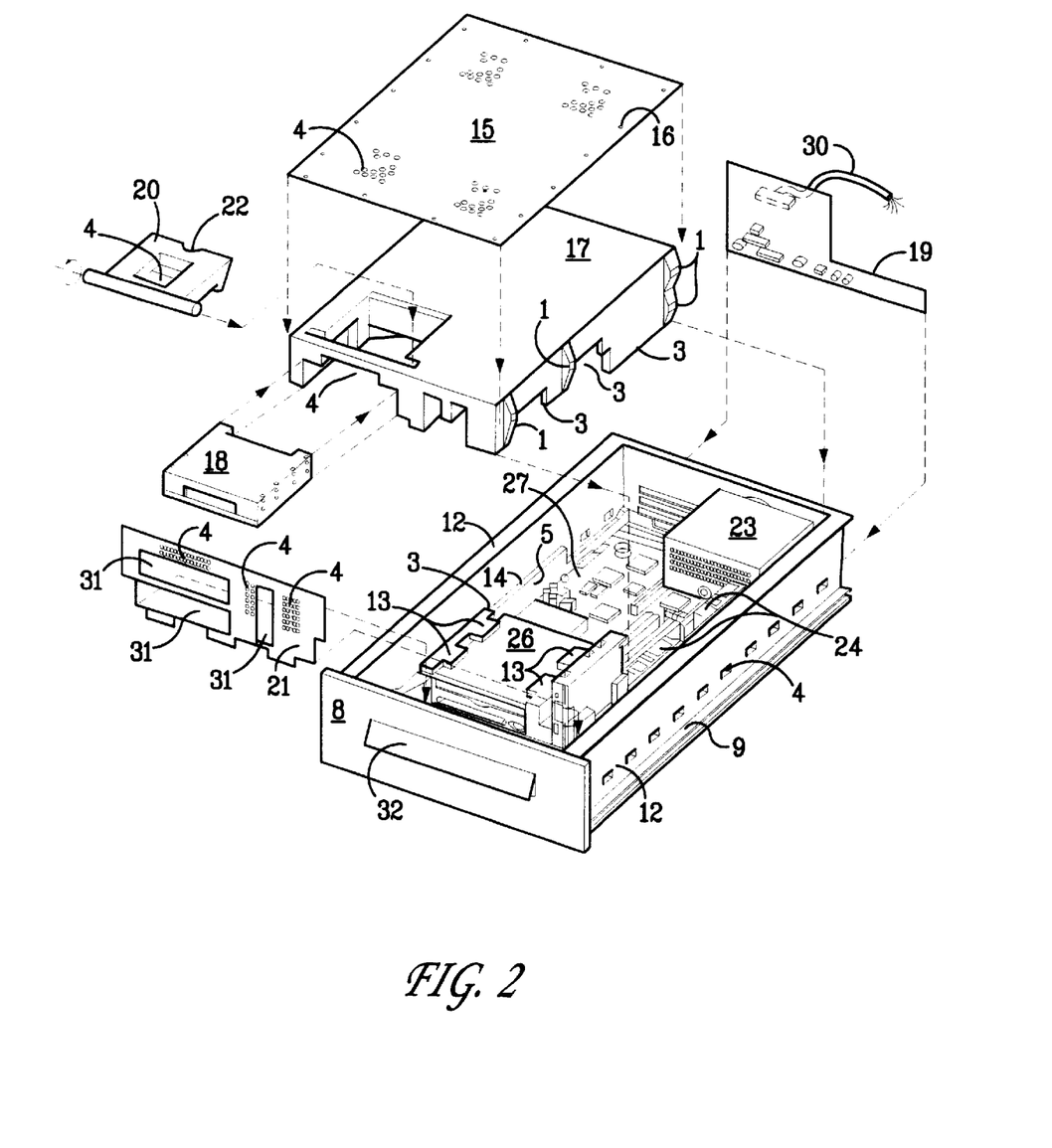
FIG. 2 is an exploded view of the inventive housing shown in FIG. 1 along with several device components to be held in the housing assembly.

FIG. 2 provides a partially exploded view of the drawer 12, chassis 5, 17, and several device components which are to be positioned within the chassis 5, 17. As shown, a printed circuit board 27, a power supply unit 23, and information storage media drives 24, 25, 26 have been positioned within the lower portion 5 of the chassis. The front panel 8 is shown secured to the drawer 12. A front plate 21 serves to close off the front of the chassis 5, 17. The front plate 21 has air inlet/outlet openings 4 as well as openings 31 for inserting information storage media into the drives 24, 25, 26 that are positioned within the chassis behind the front plate 21. A connection board 19 for establishing the external electrical connections is also shown at the rear of the drawer 12. The connection board 19 may be equipped with cables 30, plugs, or spring clips depending on the components enclosed within the chassis 5,17.

Like the lower part 5, the upper part 17 of the chassis 5, 17 is made from plastic as previously described, preferably expanded polypropylene. As shown, the upper part 17 of the chassis also has integrated compliant yet dimensionally stable projections 1 which compensate for tolerances and which act as clamps when the chassis is fitted in the drawer 12. As with the projections 1 on the lower portion of the chassis, the plastic from which the projections 1 are made, in contrast with the plastic used in the prior art, is sufficiently flexible that the chassis can be seated in a drawer 12 even if it does not fit perfectly.

As previously described, air channeling ducts 3 are created by the gaps between the projections 1.

A drive 18 for an information storage medium is also shown in FIG. 2. The drive 18 rests on top of the supports 13 that act as clamping elements for drives or other larger components located beneath the supports 13. The drive 18 is held in position from above by a specially configured flap 20 with a pivoted axis that is clamped or pressed into an appropriate opening in the upper part 17 of the chassis. This flap 20 is made entirely of plastic, preferably the same plastic as the upper part 17 of the chassis, and is provided with an air inlet/outlet opening 4 and a hand recess 22.

In the preferred embodiment, the whole of the structure is covered from above by a shielding plate 15 or some similar device or material in order to provide electric shielding. The shielding plate 15 is equipped with air inlet/outlet openings 4. The shielding plate 15 can be secured to the chassis with screws, clips, glue, or by any other appropriate means of attachment. As mentioned above, the upper 17 and lower 5 chassis parts may additionally or alternatively be enveloped in metallic foil so as to provide electrical shielding. Of course, any such foil covering must have perforations in the appropriate locations to allow for air flow into and out of the chassis 5, 17.

Figure 3:
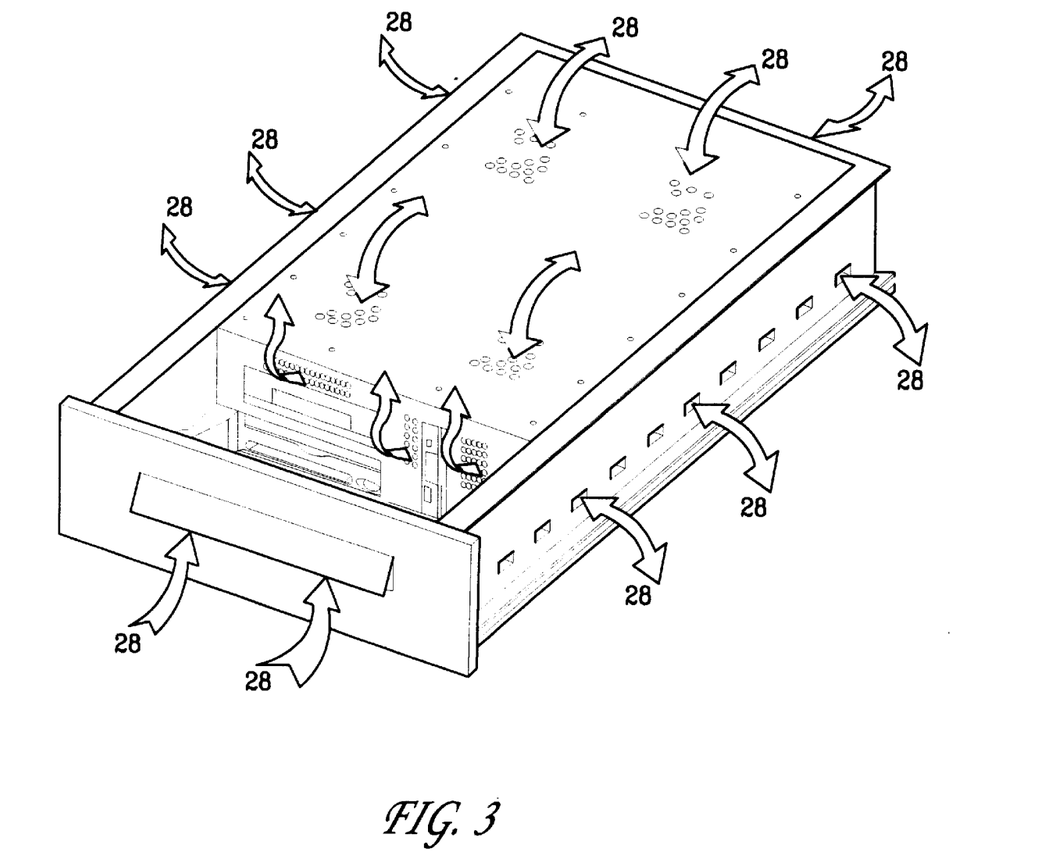
FIG. 3 is a view of the housing assembly and several device components in an assembled state and prepared to be inserted into a drawer opening.

FIG. 3 provides a view of the assembled chassis 5,17 drawer 12, and components previously illustrated in FIGS. 1 and 2. Air flow is channeled and controlled by the openings in the drawer 12 and chassis 5,17. Arrows 28 indicate the direction of the incoming/outgoing air. As indicated by the direction of the arrows 28, it is advantageous if the air flows in through the front aperture which is covered by the front panel of the drawer 12.

In the preferred embodiment, a free space 32 is created between the front plate 8 of the drawer 12 and the front panel 21 of the chassis 5,17. The space 32 provides clearance so that information storage media such as floppy disks and cd-roms can be easily removed and inserted into the various media drives which may be located in the chassis 5,17. The drives can be installed at a slant (up to the angle specified for the drives) to further facilitate access.

Figure 4:
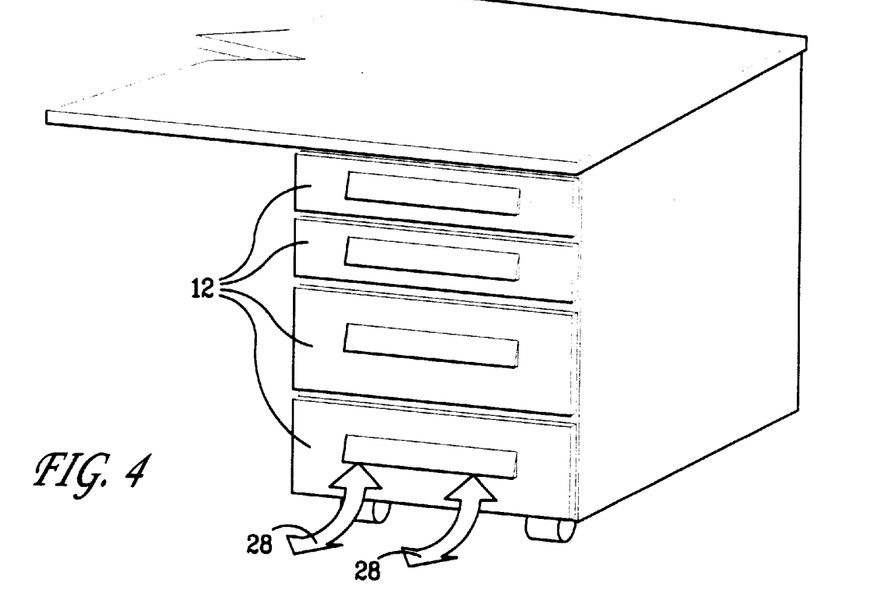
FIG. 4 is a front view of a piece of furniture incorporating the inventive housing assembly.
Figure 5:
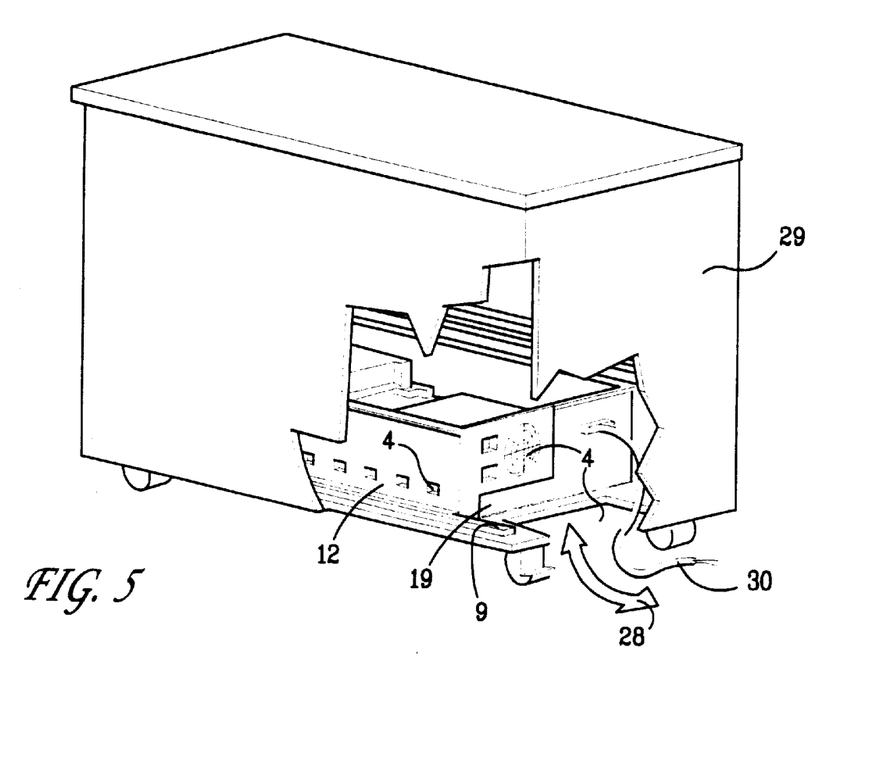
FIG. 5 is a rear view of the same piece of furniture shown in FIG. 4 incorporating the inventive housing assembly.

FIGS. 4 and 5 provide a perspective view of the inventive housing assembly 12 which has been inserted into a furniture module such as a desk 29. It should be noted that although the invention is illustrated with respect to a desk 29, any furniture which is equipped with drawers, particularly metal drawers, is suitable, whether it is designed for commercial or private use. FIG. 4 provides a front perspective view of the desk 29. As shown, multiple drawers 12 may be inserted into a single desk 29. In the preferred embodiment, when air flow 28 is channeled through the handle of the drawer 12 and the main air intake and removal 28 takes place at the rear of the desk 29, as shown in FIG.

5, the bottom drawer opening is optimally used to receive the inventive housing assembly 12. Of course, other drawer openings may be used.

FIG. 5 provides a rear view, partially in section, of the desk 29 shown in FIG. 4. As shown, the guide rails 9 of the drawer 12 interact with the appropriately receptacles in the desk 29 so as to allow the drawer 12 to be easily inserted and removed from the desk 29 and thereby provide easy access to the components located in the drawer 12. Also shown is the connection board 19 at the rear of the drawer 12 with a cable 30 extending therefrom. As indicated by the arrows, the air flow 28 is channeled through the air inlet/outlet openings 4 when the equipment has been assembled.

A housing assembly in accordance with the present invention has numerous advantages in addition to those described above. The housing assembly is lightweight and easy to dismantle, requiring only that the upper chassis part 17 be removed from the lower chassis part 5 or alternatively the whole chassis 5, 17 removed from the drawer 12. Generally, no tools are required. In this way access can be easily had to the components located within the chassis 5, 17. The ease of access to components facilitates maintenance and lessens the difficulty of returning a component or entire device to the manufacturer.

The flexibility of the plastic from which the chassis is manufactured provides numerous benefits. Due to the flexibility of the chassis material, production tolerances may be less demanding than in prior art chassis made from metal or rigid plastic which required that components and chassis be manufactured with great precision. The flexibility and elasticity of the projections extending from the chassis provide that the chassis can be easily inserted into a drawer or housing. Additionally, a chassis in accordance with the present invention is impact absorbent which protects components situated in the chassis. This feature provides the potential for using less packaging when shipping devices, which has the residual effect of lowering the transport volume and price. Applicants have noted that a chassis in accordance with the present invention also provides very good acoustic insulation.

Although the present invention has been illustrated with respect to computer and electronics components, it should be emphasized that the inventive housing for a device can be used to house virtually any kind of component. For example, optical or mechanical components can be housed in the chassis. Multimedia systems or televisions may be also housed in the housing assembly. Alternatively, signal transmitters and testing equipment or measuring instruments such as oscillographs, spectrum analyzers, multi meters and technical medical equipment may be housed in the device. The components of a liquid chromatograph such as pumps, syringes, valves, control and data processing units, and detector devices may be housed in the device. The ducts for the liquids which are typically employed in a liquid chromatograph can be produced in the chassis material during the molding process so that no tubes of the kind required in a conventional chromatograph are necessary.

The present invention may be embodied in other specific forms without departing from the spirit or essential attributes thereof. For example, the chassis may comprise one, two, or more parts in which components may be housed. The housing which is described above with reference to a drawer, may be in the form of any other furniture component which is integrally coupled with a piece of furniture. Accordingly, reference should be made to the appended claims as indicating the scope of the invention.

What is claimed is:

1. An assembly for holding components, integrally cooperating with a unit of furniture, comprising:
 a chassis for holding the components; and
 a housing into which said chassis is substantially placed, wherein said housing is integrally interfaced with the unit of furniture and may be substantially inserted into the unit of furniture to provide storage for said chassis and the components situated therein and removed from the unit of furniture so as to provide access to said chassis and the components situated therein, said chassis having a plurality of projections extending therefrom for providing clearance through which air can circulate between said chassis and said housing.

2. An assembly as recited in claim 1, wherein said housing comprises:
 a bottom having a plurality of recesses therein; and
 vertical walls extending from said bottom, said walls having perforations therein through which air may flow.

3. An assembly for holding components, integrally cooperating with a unit of furniture, comprising:
 a chassis for holding the components; and
 a housing into which said chassis is substantially placed, wherein said housing is integrally interfaced with the unit of furniture and may be substantially inserted into the unit of furniture to provide storage for said chassis and the components situated therein and removed from the unit of furniture so as to provide access to said chassis and the components situated therein,
 wherein said housing comprises:
  a bottom having a plurality of recesses therein; and
  vertical walls extending from said bottom, said walls having perforations therein through which air may flow and
 wherein said chassis comprises:
  a lower chassis part having:
   a plurality of cavities therein for receiving the components;
   a plurality of projections extending downward from the bottom of said lower chassis part which integrally cooperate with the recesses in said bottom of said housing for holding said lower chassis part in place relative to said housing;
   a plurality of projections extending sideways from said lower chassis part to said vertical walls of said housing for holding the lower part of the chassis in place relative to said housing and for providing clearance between the walls of said housing and thereby create air channeling ducts for air to flow through said housing to the components in said chassis;
  said chassis further comprising an upper chassis part which is integrally connected to said lower chassis part and which cooperates with said lower chassis part to hold the components in place, said upper chassis part having:
   a plurality of cavities for receiving the components when placed over said lower chassis part; and
   a plurality of projections extending sideways from said upper chassis part to said vertical walls of said housing for holding said upper chassis in place relative to said housing and for providing clearance between the walls and said housing and thereby create channeling ducts for air to flow through said housing to the components in said chassis.

4. An assembly as recited in claim 3, further comprising at least one duct insert which may be positioned in the channeling ducts created between said housing and said upper and said lower chassis parts by said projections from said upper and lower chassis parts, so as to direct the flow of air to the components as appropriate.

5. An assembly as recited in claim 3 further comprising a metallic shielding member which is positioned substantially over said upper chassis part so as to shield the components from electrical disturbances.

6. An assembly as recited in claim 3, wherein said lower chassis part has at least one support element integrated therein for providing support to a component such as a disk drive.

7. An assembly as recited in claim 3, wherein said upper chassis part has a plastic flap hinged therefrom for securing at least one disk drive.

8. An assembly as recited in claim 3 wherein said housing has a front and back, further comprising a chassis sealing plate having ventilation openings and openings for inserting storage media into media drives located in said chassis behind said sealing plate, said chassis sealing plate positioned at a sufficient distance behind the front of said housing to allow insertion of said storage media into said media drives.

9. An assembly as recited in claim 1 wherein said housing is a drawer and the unit of furniture is a desk.

10. An assembly as recited in claim 1 wherein said housing is made from metal.

11. An assembly as recited in claim 1 wherein said housing is lined with an electrically conductive film.

12. An assembly as recited in claim 1 wherein said chassis is made from plastic with a density of about 60 to 80 grams/liter.

13. An assembly as recited in claim 1 wherein said chassis is made from expanded polypropylene.

14. An assembly as recited in claim 1 wherein said chassis is composed from either polyurethane or expanded polyethylene.

15. An assembly as recited in claim 1 further comprising a foil film enveloping said chassis and having perforations therein.

16. An assembly for accommodating equipment components, comprising:
   a chassis for holding the components;
   a housing into which said chassis is substantially placed, said chassis having a plurality of projections extending therefrom for providing clearance through which air can circulate between said chassis and said housing; and
   a unit of furniture having a receptacle for accepting said housing, wherein said housing may be substantially inserted into the receptacle to provide storage for said chassis and the components situated therein and removed from the receptacle so as to provide access to said chassis and the components situated therein.

17. An assembly as recited in claim 16 wherein said unit of furniture is a desk.

18. An assembly as recited in claim 16 wherein said unit of furniture is a cabinet.

19. An equipment component casing for integrally coupling equipment components with a unit of furniture having a drawer receptacle, comprising:
   a blown plastic chassis having cavities therein for holding the equipment components and air ducts for routing air to the equipment components; and
   a drawer into which said plastic chassis is placed, wherein said drawer is movably coupled with the unit of furniture so as to insert said drawer into the drawer receptacle and remove said drawer from the drawer receptacle, said blown plastic chassis having a plurality of projections extending therefrom for providing clearance through which air can circulate between said chassis and said drawer.

20. An equipment component casing as recited in claim 19 wherein said drawer is made of a metallic material.

21. An assembly as recited in claim 2, wherein said chassis comprises:
   a lower chassis part having:
      a plurality of cavities therein for receiving the components;
      a plurality of projections extending downward from the bottom of said lower chassis part which integrally cooperate with the recesses in said bottom of said housing for holding said lower chassis part in place relative to said housing;
      a plurality of projections extending sideways from said lower chassis part to said vertical walls of said housing for holding the lower part of the chassis in place relative to said housing and for providing clearance between the walls of said housing and thereby create air channeling ducts for air to flow through said housing to the components in said chassis;
   said chassis further comprising an upper chassis part which is integrally connected to said lower chassis part and which cooperates with said lower chassis part to hold the components in place, said upper chassis part having:
      a plurality of cavities for receiving the components when placed over said lower chassis part; and
      a plurality of projections extending sideways from said upper chassis part to said vertical walls of said housing for holding said upper chassis in place relative to said housing and for providing clearance between the walls and said housing and thereby create channeling ducts for air to flow through said housing to the components in said chassis.

22. An assembly as recited in claim 3, further comprising at least one duct insert which may be positioned in the channeling ducts created between said housing and said upper and said lower chassis parts by said projections from said upper and lower chassis parts, so as to direct the flow of air to the components as appropriate.

23. An assembly as recited in claim 3 further comprising a metallic shielding member which is positioned substantially over said upper chassis part so as to shield the components from electrical disturbances.

24. An assembly as recited in claim 3, wherein said lower chassis part has at least one support element integrated therein for providing support to a component such as a disk drive.

25. An assembly as recited in claim 3, wherein said upper chassis part has a plastic flap hinged therefrom for securing at least one disk drive.

26. An assembly as recited in claim 3 wherein said housing has a front and back, further comprising a chassis sealing plate having ventilation openings and openings for inserting storage media into media drives located in said chassis behind said sealing plate, said chassis sealing plate positioned at a sufficient distance behind the front of said housing to allow insertion of said storage media into said media drives.

* * * * *